United States Patent

Trinh

Patent Number: 5,779,816
Date of Patent: Jul. 14, 1998

[54] NOZZLE AND SYSTEM FOR USE IN WAFER CLEANING PROCEDURES

[76] Inventor: Tieu T. Trinh, 601 Kathleen La., Leander, Tex. 78641

[21] Appl. No.: 794,223

[22] Filed: Jan. 30, 1997

[51] Int. Cl.⁶ .................................................. B08B 3/02
[52] U.S. Cl. .................... 134/23; 134/25.4; 134/148; 134/153; 134/198; 134/402; 239/550
[58] Field of Search ................................ 134/147, 148, 134/149, 153, 157, 198; 239/550, 563

[56] References Cited

U.S. PATENT DOCUMENTS

| 3,041,225 | 6/1962 | Emeis | 134/153 |
|---|---|---|---|
| 3,990,462 | 11/1976 | Elftmann et al. | 134/102 |
| 4,557,785 | 12/1985 | Ohkuma | 156/345 |
| 4,564,280 | 1/1986 | Fukuda | 134/153 |
| 4,688,918 | 8/1987 | Suzuki et al. | 134/902 |
| 4,771,948 | 9/1988 | Furukawa et al. | 239/565 |
| 4,795,497 | 1/1989 | McConnell et al. | 134/18 |

FOREIGN PATENT DOCUMENTS

| 3-109733 | 5/1991 | Japan | 134/902 |
|---|---|---|---|
| 4-133491 | 5/1992 | Japan | 134/902 |
| 5-166773 | 7/1993 | Japan | 134/902 |
| 5-326481 | 12/1993 | Japan | 134/902 |
| 6-124887 | 5/1994 | Japan | 134/902 |
| 118730 | 4/1947 | Sweden | 134/153 |

OTHER PUBLICATIONS

European Patent Application (EPO) 509,097, Oct. 1992.

*Primary Examiner*—Frankie L. Stinson
*Attorney, Agent, or Firm*—Skjerven, Morrill, MacPherson, Franklin & Friel L.L.P.; M. Kathryn Braquet Tsirigotis

[57] ABSTRACT

The present invention provides a system for wet processing a wafer which includes a processing chamber, in which the wafer is processed, and a means for supporting and rotating the wafer about an upright axis within the processing chamber. A nozzle through which a flow of fluid is directed onto the wafer is positioned downwardly over the wafer. The nozzle includes a nozzle housing in communication with a fluid supply and at least two tubes forming angled extensions from the nozzle housing. Each tube has an inner end and an outer end and directs a fluid flow from the inner end through the outer end to a predetermined location on the wafer while the wafer is rotated within the processing chamber. The inner end of each tube has an angled opening larger than the diameter of the inner end of each tube and the diameter of the outer end of each the tube is larger than the diameter of the inner end which reduces the fluid pressure and increases the fluid flow rate. The outer end of each tube also has an angled opening larger than the diameter of the outer end of each tube which contributes to a substantially constant fluid flow onto the wafer. In a preferred embodiment, the nozzle includes two tubes. A first tube directs a first fluid flow to a center area of the wafer and a second tube directs a second fluid flow to an area of the wafer substantially one-third the diameter of the wafer. The rotation of the wafer will cause the fluid to overflow toward the outer edge of the wafer, to thoroughly clean the wafer.

35 Claims, 3 Drawing Sheets

NOZZLE AND SYSTEM FOR USE IN WAFER CLEANING PROCEDURES

BACKGROUND OF THE INVENTION

1. Field of the Invention

The field of the invention relates generally to a system for wet processing wafers, and, more particularly, to a nozzle equipment and wafer cleaning method.

2. Description of the Related Art

In manufacturing precision circuits for use in highly sophisticated equipment such as computers and the like, wafers or substrates form the base material for such printed circuitry and may be made of silicon, glass, ceramic materials of various sorts, and other similar materials in very thin wafer-like form. In semiconductor manufacturing there are many wet processes, such as washing and etching of the substrates or wafers. Many wet processes treat the wafers one by one by holding the wafer and treating the wafer in a cup containing the chemicals (immersion treatment), or spraying the chemicals on the surface of the wafer (spray treatment). In a typical example of spray treatment, the wafer is fixed on a chuck and rotated about its axis and chemicals or water is misted or sprayed, usually under pressure, onto the surface of the wafer from a nozzle.

Scrupulously clean wafers are critical for obtaining high yields in VLSI fabrication. Wafer cleaning is a complex subject as there are many possible kinds of contamination. The two general categories of wafer contamination are particulates and films. Particulates are any bits of material present on a wafer surface that have readily definable boundaries. As feature sizes shrink, the sizes of particulates that can cause defects also increase. Particulate sources include silicon dust, quartz dust, atmospheric dust, and particles originating from clean room personnel and processing equipment, lint, photoresist chunks and bacteria.

As there are two classes of contamination, so there are separate cleaning procedures to remove each of them. That is, both chemical cleaning procedures and particulate cleaning techniques must be employed to produce a completely clean surface. However, both chemical and particulate cleaning procedures involve rinses with deionized and filtered water (DI water). The use of centrifugal spray cleaning instead of immersion in cleaning solutions has a number of advantages including the consumption of smaller volumes of chemicals or water and continually exposing wafer surfaces to fresh chemical solutions or water. In many procedures a mist spray style nozzle is used which pressurizes the DI water into a mist that sprays on the wafer during cleaning. However, problems occur in using the pressure mist nozzle such as condensation in the wafer chamber and around the nozzle itself. This causes water droplets to form and drip onto the process wafer which may not be sufficiently removed from the surface of the wafer if, for instance, this occurs during the drying cycle, thus contaminating the wafer. Another problem caused by the small orifice misting nozzle is that the pressurized water stream, when injected onto the wafer surface, causes a back splash thus contaminating the process chamber.

SUMMARY OF THE INVENTION

The present invention provides a system for wet processing a wafer or substrate wherein misting, backsplash and clogging are eliminated allowing a more controlled wet processing system and a rinse process that produces cleaner wafers. More particularly, a system for wet processing a wafer is disclosed which includes a processing chamber, in which the wafer is processed and a means for supporting and rotating the wafer about an upright axis within the processing chamber, such as for example, a standard turntable or vacuum chuck. Also disclosed is a nozzle through which a flow of fluid is directed onto the wafer. The nozzle is positioned downwardly over the wafer and comprises a nozzle housing in communication with a fluid supply, such as deionized water, and at least two tubes forming angled extensions from the nozzle housing. Each the tube is angled symmetrically with respect to every other tube and to the longitudinal axis of the nozzle housing.

Each tube also includes an inner end and an outer end and directs a fluid flow from the inner end through the outer end to a predetermined location on the wafer while the wafer is rotated within the processing chamber. The inner end of each tube has an angled opening larger than the diameter of the inner end of each tube and the diameter of the outer end of each the tube is larger than the diameter of the inner end which reduces the fluid pressure and increases the fluid flow rate. The outer end of each tube has an angled opening larger than the diameter of the outer end of each tube which contributes to a substantially constant fluid flow. The inner ends of the tubes form wedged partitions within the nozzle housing wherein the flow of fluid through the nozzle housing is separated into a fluid flow directed through each tube. The system also includes a control valve for controlling the flow of fluid supplied to the nozzle housing and a flow meter connected to the control valve indicating the flow of fluid through the control valve.

In a preferred embodiment, the nozzle includes two tubes. A first tube directs a first fluid flow to a center area of the wafer and a second tube directs a second fluid flow to an area of the wafer substantially one-third the diameter of the wafer. The rotation of the wafer will cause the fluid to overflow toward the edge of the wafer. The system of the present invention, therefore, simply and efficiently performs a wafer rinsing process without misting or backsplash which can contaminating the wafer and processing chamber.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
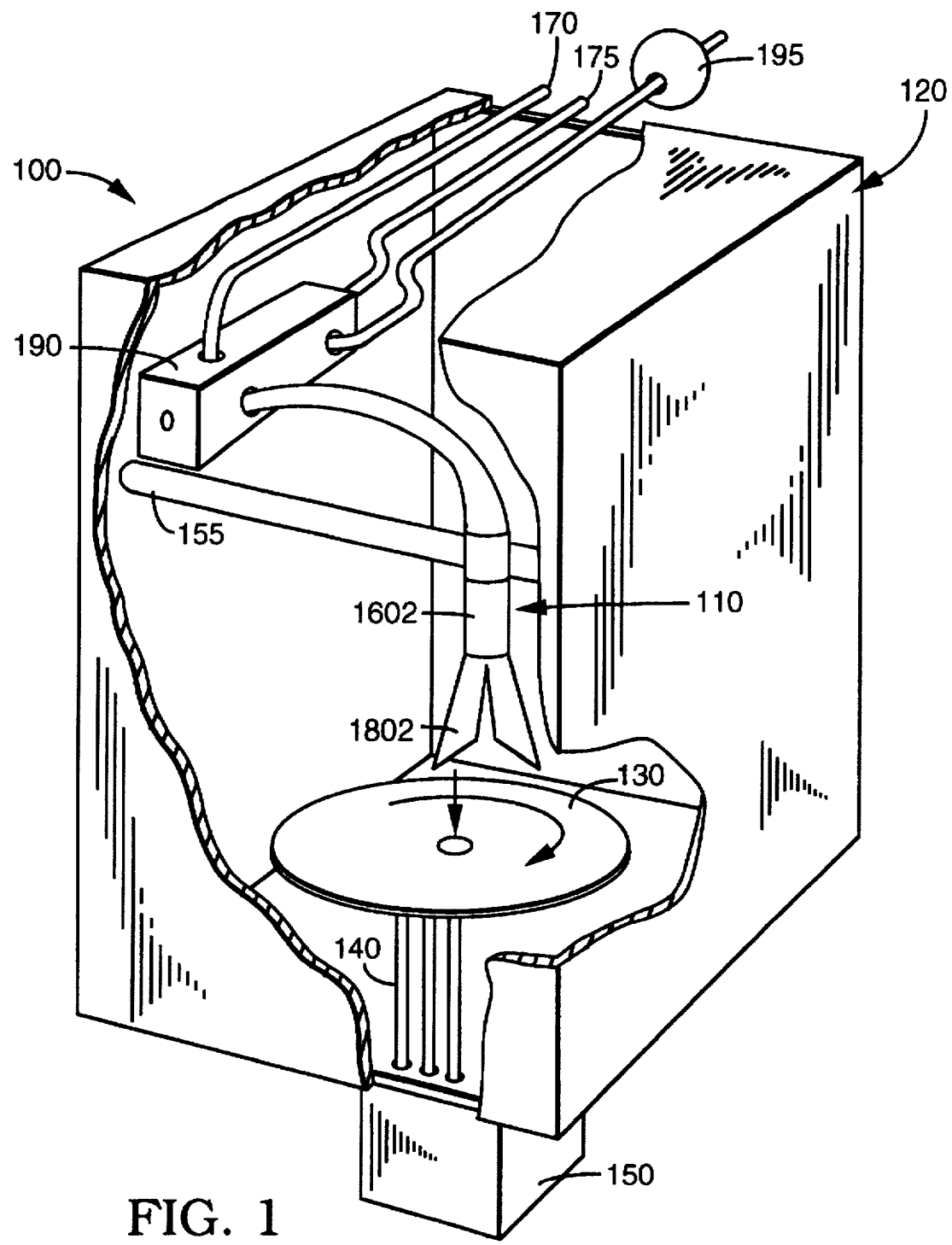
FIG. 1 is a perspective view, cut-away for clarity, illustrating a system for wet processing a wafer according to the present invention.

In the description which follows, like parts are marked throughout the specification and drawings with the same reference numerals, respectively. The drawing figures are not necessarily to scale, and certain features of the invention may be shown exaggerated in scale or cut-away in the interest of clarity and conciseness.

Referring now to FIG. 1, illustrated is a perspective view, cut away for clarity, of a wet processing system 100 which incorporates a nozzle 110 in accordance with the present invention. The wet processing system 100 includes a processing chamber 120 in which a wafer 130 is processed. A wet process includes, for example, a rinsing process as will be described in this FIG. 1. A means for supporting and rotating the wafer 130 about an upright axis within the processing chamber 120, such as for example, the vacuum chuck 140 and rotating motor 150 illustrated, rotate the wafer 130 while processing or rinsing. However, other standard means for rotating the wafer 130, such as, for example, a turntable, may also be used. The nozzle 110 is positioned downwardly over the wafer 130 and is supported, for example, by a mounting bar 155.

The nozzle 110 includes a nozzle housing 160 in communication with a fluid supply 170 and at least two tubes 180 which form angled extensions from the nozzle housing 160. The fluid supply 170 is, for example, deionized water such as is used in a rinsing process. Each tube 180 directs a fluid flow to a predetermined location on the wafer 130 while the wafer 130 is rotated within the processing chamber 120. The wet processing system 100 also includes a control valve 190 for controlling the flow of fluid supplied to the nozzle housing 160 and a flow meter 195 connected to the control valve 190 indicating the flow of fluid through the control valve 190. An exhaust 175, such as, for example, a Venturi™ exhaust, is connected to the control valve 190 and is used to remove excess fluid which helps control fluid flow and helps prevent clogging of the control valve 190.

The system of the present invention uses gravity, by positioning the nozzle 110 downwardly over the wafer 130 and including tubes 180 designed to give substantially constant fluid flows, and centrifugal force, by directing fluid flows to predetermined areas on the wafer 130 wherein, during a rinsing process, the wafer 130 is rinsed from the center towards the outer edge, to thoroughly clean the wafer 130. In the preferred embodiment as illustrated in FIG. 1, a first tube 180 directs a first fluid flow to the center area on the wafer 130 and a second tube 180 directs a second fluid flow to an area of the wafer 130 substantially one third the diameter of the wafer 130 while the wafer 130 is rotated. Removable residue is rinsed or flooded off toward the outer edge of the wafer 130. The second fluid flow boosts the wafer 130 rinsing or flooding force to remove substantially all residue and chemical solutions on the surface of the wafer.

Figure 2:
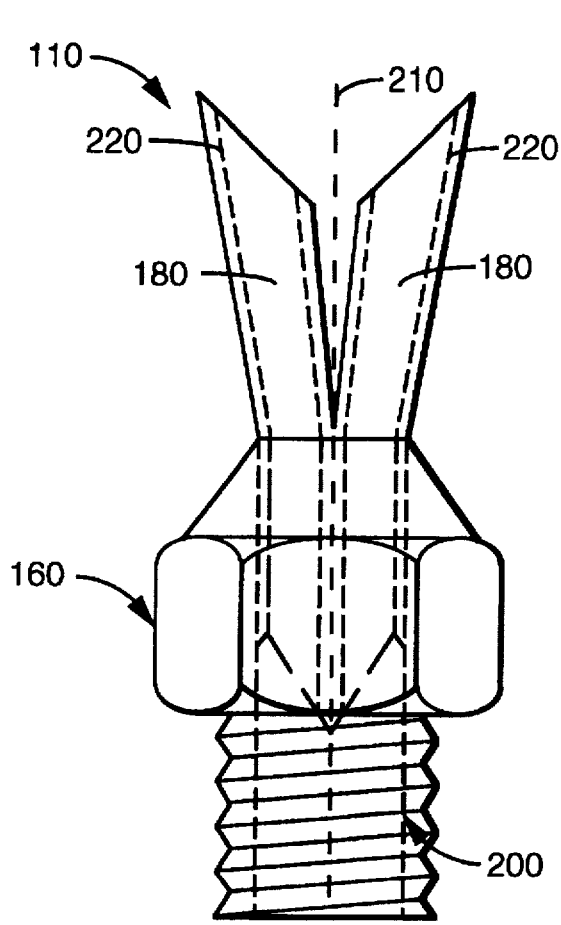
FIG. 2 is a side view of a nozzle according to a preferred embodiment of the present invention, including see-through dotted lines indicating the inner diameters of tubes used for directing fluid flow.

FIG. 2 illustrates the nozzle 110 of the present invention in greater detail. The nozzle housing 160 includes a threaded portion 200, for example, to facilitate communication with the fluid supply 170. As illustrated in FIG. 2, each tube 180 is angled symmetrically with respect to every other tube 180 and to the longitudinal axis 210 of the nozzle housing 160. The see-through dotted lines indicate the inner diameters 220 of tubes 180.

Figure 3:
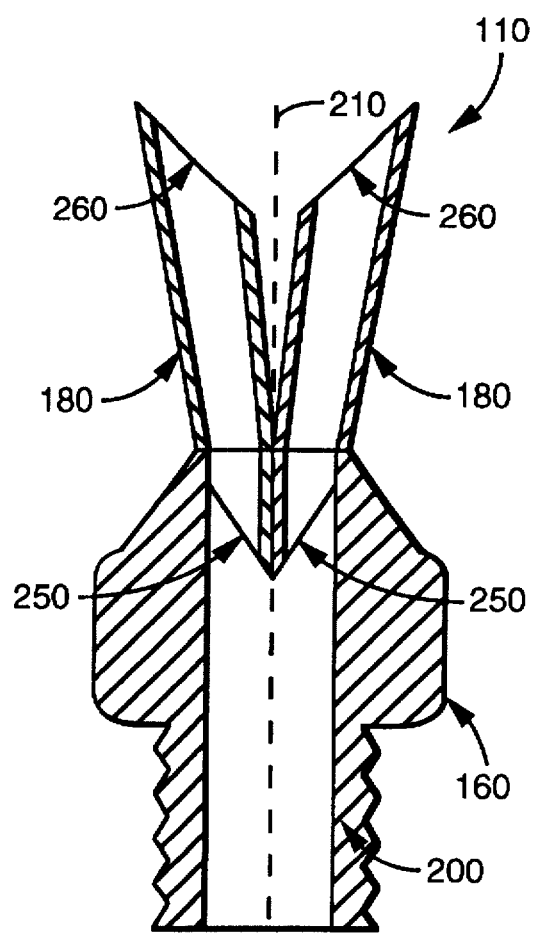
FIG. 3 is a cross sectional view of the nozzle illustrated in FIG. 2.
Figure 4:
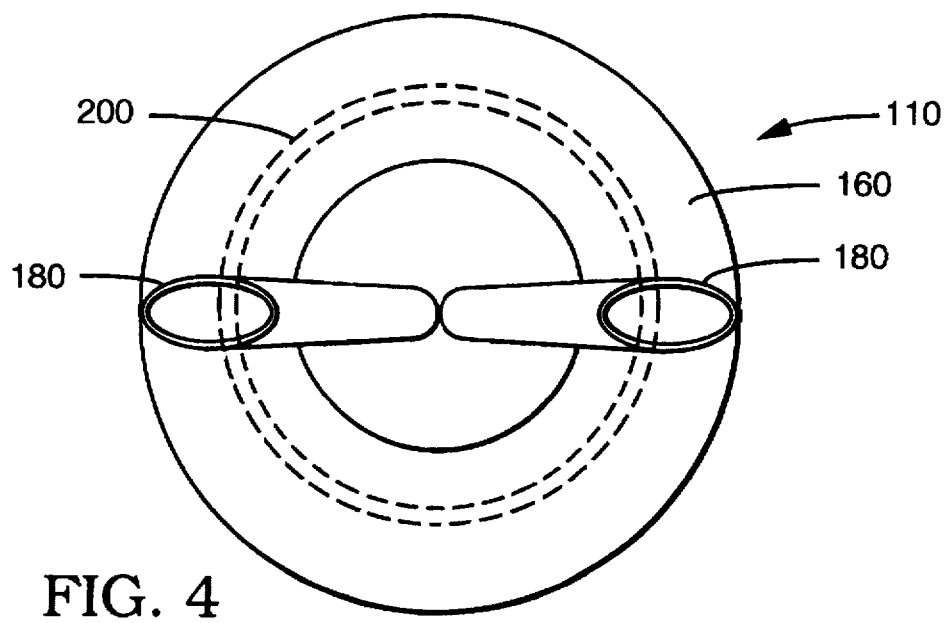
FIG. 4 is a top view of the nozzle illustrated in FIG. 2.

FIG. 3 illustrates a cross sectional view of the nozzle illustrated in FIG. 2 and FIG. 4 illustrates a top view of the nozzle illustrated in FIG. 2. The nozzle 110 includes at least two tubes 180 forming angled extensions from the nozzle housing 160. Each tube 180 has an inner end 250 and an outer end 260, wherein each tube 180 directs a fluid flow from the inner end 250 through the outer end 260 to a predetermined location. The inner ends 250 of the tubes 180 form wedged partitions within the nozzle housing 160 wherein the flow of fluid through the nozzle housing 160 is separated into a fluid flow directed through each tube 180.

The inner end 250 of each tube 180 has an angled opening larger than the diameter 220 of the inner end 250, and the diameter 220 of the outer end 260 of each tube 180 is larger than the diameter 220 of the inner end 250 of each tube 180, therefore, the fluid pressure is reduced and the fluid flow rate is increased as the fluid flows through each tube which allows for a substantially constant fluid flow. The outer end 260 of each tube 180 has an angled opening larger than the diameter 220 of the outer end 260 of each tube 180 which contributes to the substantially constant fluid flow through the tubes 180 to the wafer 130. The angled opening of the inner end 250 of each tube 180 is angled, for example, in the range of 60±5 degrees. The angled opening of the outer end 260 of each tube 180 is angled, for example, in the range of 45±5 degrees. Each tube 180 is angled symmetrically with respect to every other tube 180 and to a longitudinal axis 210 of the nozzle housing 160, for example, in a preferred embodiment wherein the nozzle 110 includes two tubes 180, each of the tubes 180 are angled, for example, in the range of 8±5 degrees with respect to the longitudinal axis 210 of the nozzle housing 160.

Figure 5A:
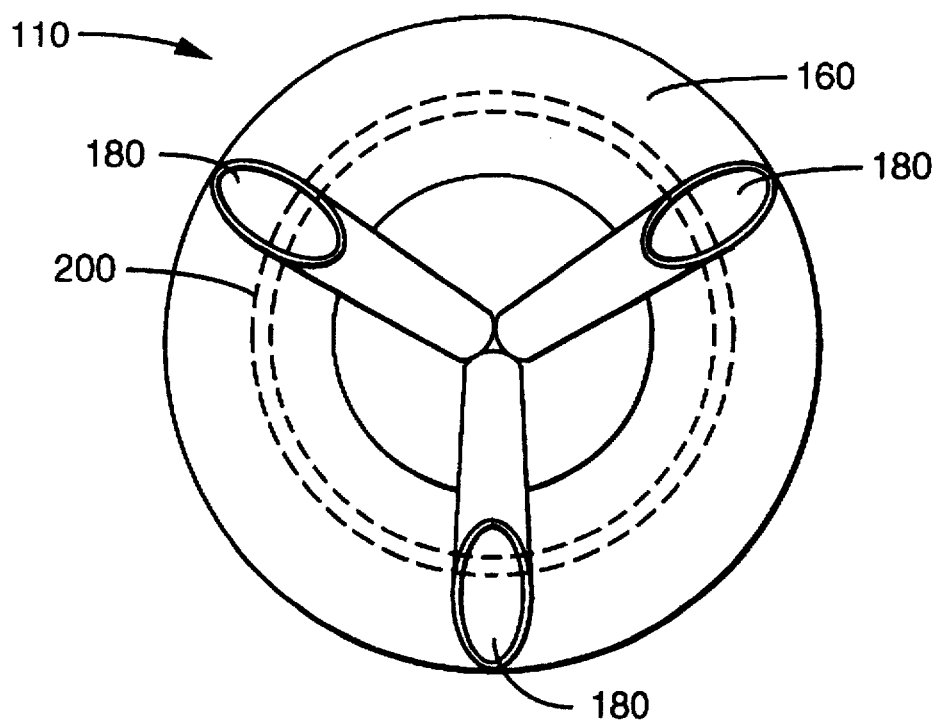
FIGS. 5A AND 5B show embodiments of the nozzle of the present invention illustrating the use of three tubes (FIG. 5A) and four tubes (FIG. 5B) for directing fluid flow.
Figure 5B:
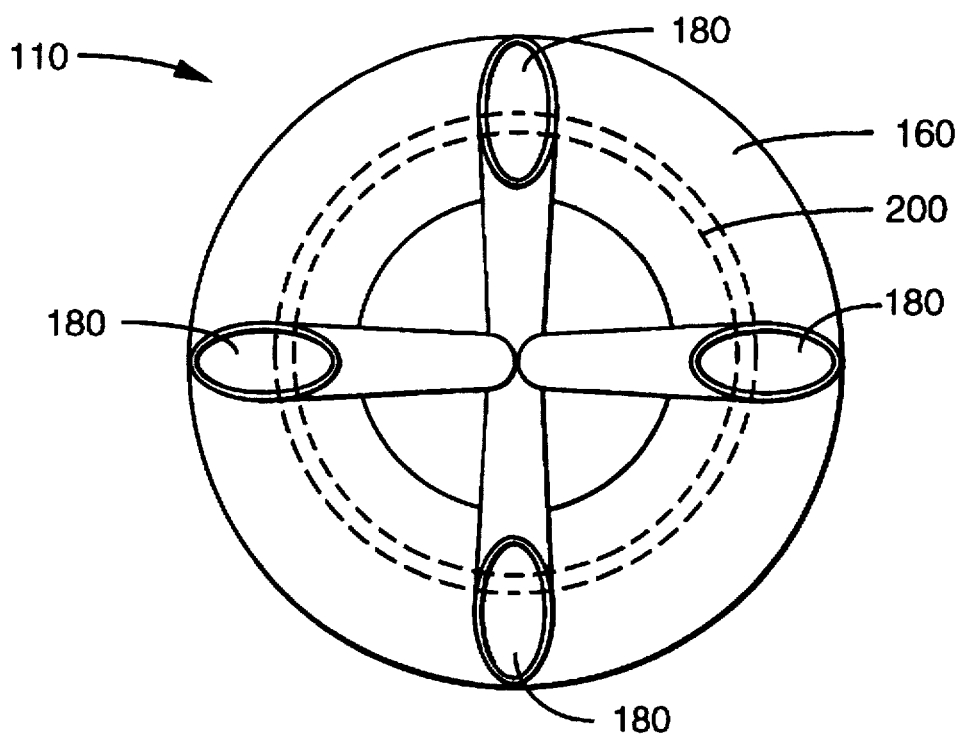

FIGS. 5A and 5B illustrated embodiments of the nozzle 110 of the present invention showing the nozzle housing 160 including the threaded portion 200 and having three tubes 180 (FIG. 5A) and four tubes 180 (FIG. 5B) for directing fluid flows to predetermined locations on a wafer or substrate.

While there has been illustrated and described particular embodiments of the present invention, it will be appreciated that numerous changes and modifications will occur to those skilled in the art, and it is intended in the appended claims to cover all those changes and modifications which fall within the true spirit and scope of the present invention.

The present invention accomplishes wet processing of wafers or substrates while eliminating misting, backsplash and clogging during spray treatments which can contaminate the wafers and process chambers. Other embodiments are within the following claims, and, while only certain preferred features of the invention have been shown by way of illustration, many modifications and changes will occur. It is therefore to be understood that the present claims are intended to cover all such modifications and changes which fall within the true spirit of the invention.

What is claimed is:

1. An apparatus for wet processing a wafer, the apparatus comprising:

a processing chamber, wherein the wafer is processed in the processing chamber;

a means for supporting and rotating the wafer about an upright axis within the processing chamber; and a nozzle through which a flow of fluid is directed onto the wafer, the nozzle comprising;

a nozzle housing in communication with a fluid supply;

at least two tubes forming angled extensions from the nozzle housing, each tube having an inner end and an outer end, wherein each tube directs a fluid flow from the inner end through the outer end to a predetermined location on the wafer while the wafer is rotated within the processing chamber; and wherein the nozzle is positioned downwardly over the wafer; and wherein a first tube directs a first fluid flow to a center area of the wafer and a second tube directs a second fluid flow to an area of the wafer at least substantially one-third the diameter of the wafer and wherein the rotation of the wafer causes the fluid to overflow toward the outer edge of the wafer.

2. An apparatus according to claim 1 wherein the inner ends of the tubes form wedged partitions within the nozzle housing wherein the flow of fluid through the nozzle housing is separated into a fluid flow directed through each tube.

3. An apparatus according to claim 1 wherein the second tube directs the second fluid flow to an area of the wafer substantially one-third the diameter of the wafer.

4. An apparatus for wet processing a wafer, the apparatus comprising:
   a processing chamber, wherein the wafer is processed in the processing chamber;
   a means for supporting and rotating the wafer about an upright axis within the processing chamber; and
   a nozzle through which a flow of fluid is directed onto the wafer, the nozzle comprising:
      a nozzle housing in communication with a fluid supply;
      at least two tubes forming angled extensions from the nozzle housing, each tube having an inner end and an outer end, wherein each tube directs a fluid flow from the inner end through the outer end to a predetermined location on the wafer while the wafer is rotated within the processing chamber; and
   wherein the nozzle is positioned downwardly over the wafer; and
   wherein the inner end of each tube has an angled opening larger than the diameter of the inner end of each tube and wherein the diameter of the outer end of each the tube is larger than the diameter of the inner end of each the tube wherein the fluid pressure is reduced and the fluid flow rate is increased as the fluid flows through each the tube.

5. An apparatus according to claim 4 wherein the angled opening of the inner end of each the tube is angled in the range of 60±5 degrees.

6. An apparatus according to claim 1 wherein the outer end of each tube has an angled opening larger than the diameter of the outer end of each tube.

7. An apparatus according to claim 6 wherein the angled opening of the outer end of each the tube is angled in the range of 45±5 degrees.

8. An apparatus according to claim 1 wherein each the tube is angled symmetrically with respect to every other tube and to a longitudinal axis of the nozzle housing.

9. An apparatus according to claim 8 wherein the nozzle includes a first and a second tube and wherein each of the first and second tubes is angled in the range of 8±5 degrees with respect to the longitudinal axis of the nozzle housing.

10. An apparatus according to claim 1 further comprising a control valve controlling the flow of fluid supplied to the nozzle housing.

11. An apparatus according to claim 10 further comprising a flow meter connected to the control valve indicating the flow of fluid through the control valve.

12. An apparatus according to claim 1 wherein the wet process is a rinse and the fluid is deionized water.

13. A nozzle for dispensing a flow of fluid, the nozzle comprising:
   a nozzle housing in communication with a fluid supply;
   at least two tubes forming angled extensions from the nozzle housing, each tube having an inner end and an outer end, wherein each tube directs a fluid flow from the inner end through the outer end to a predetermined location;
   wherein the nozzle is positioned downwardly; and
   wherein the inner end of each tube has an angled opening larger than the diameter of the inner end of each tube and wherein the diameter of the outer end of each tube is larger than the diameter of the inner end of each tube wherein the fluid pressure is reduced and the fluid flow rate is increased as the fluid flows through each the tube.

14. A nozzle according to claim 13 wherein the inner ends of the tubes form wedged partitions within the nozzle housing wherein the flow of fluid through the nozzle housing is separated into a fluid flow directed through each tube.

15. A nozzle according to claim 14 wherein the angled opening of the inner end of each the tube is angled in the range of 60±5 degrees.

16. A nozzle according to claim 13 wherein the outer end of each tube has an angled opening larger than the diameter of the outer end of each tube.

17. A nozzle according to claim 16 wherein the angled opening of the outer end of each the tube is angled in the range of 45±5 degrees.

18. A nozzle according to claim 13 wherein each the tube is angled symmetrically with respect to every other tube and to a longitudinal axis of the nozzle housing.

19. A nozzle according to claim 18 wherein the nozzle includes a first and a second tube and wherein each of the first and second tubes is angled in the range of 8±5 degrees with respect to the longitudinal axis of the nozzle housing.

20. A nozzle according to claim 13 further comprising a control valve controlling the flow of fluid supplied to the nozzle housing.

21. A nozzle according to claim 20 further comprising a flow meter connected to the control valve indicating the flow of fluid through the control valve.

22. A method for wet processing a wafer in a processing chamber using a nozzle through which a flow of fluid is directed onto the wafer, the method comprising the steps of:
   rotating the wafer about an upright axis within the processing chamber;
   directing a flow of fluid through a nozzle, the nozzle positioned downwardly over the wafer, the nozzle comprising a nozzle housing in communication with a fluid supply and at least two tubes forming angled extensions from the nozzle housing, each tube having an inner end and an outer end; and
   directing, from the inner end through the outer end of a first tube, a first fluid flow to a center area of the wafer and directing, from the inner end through the outer end of a second tube, a second fluid flow to an area of the wafer substantially one-third the diameter of the wafer while the wafer is rotated and wherein the rotation of the wafer causes the fluid to overflow toward the outer edge of the wafer.

23. A method according to claim 22 wherein the inner ends of the tubes form wedged partitions within the nozzle housing wherein the flow of fluid through the nozzle housing is separated into a fluid flow directed through each tube.

24. A method according to claim 22 wherein the inner end of each tube has an angled opening larger than the diameter of the inner end of each tube allowing for a substantially constant fluid flow and wherein the diameter of the outer end of each tube is larger than the diameter of the inner end of each tube wherein the fluid pressure is reduced and the fluid flow rate is increased as the fluid flows through each tube.

25. A method according to claim 24 wherein the angled opening of the inner end of each tube is angled in the range of 60±5 degrees.

26. A method according to claim 22 wherein the outer end of each tube has an angled opening larger than the diameter of the outer end of each tube.

27. A method according to claim 26 wherein the angled opening of the outer end of each tube is angled in the range of 45±5 degrees.

28. A method according to claim 22 wherein each tube is angled symmetrically with respect to every other tube and to a longitudinal axis of the nozzle housing.

29. A method according to claim 28 wherein the nozzle includes a first and a second tube and wherein each of the first and second tubes is angled in the range of 8±5 degrees with respect to the longitudinal axis of the nozzle housing.

30. A method according to claim 22 further comprising the steps of:

controlling the flow of fluid supplied to the nozzle housing using a control valve; and indicating the flow of fluid through the control valve using a flow meter connected to the control valve.

31. A method according to claim 22 wherein the wet process is a rinse and the fluid is deionized water.

32. An apparatus according to claim 4 wherein the outer end of each tube has an angled opening larger than the diameter of the outer end of each tube.

33. An apparatus according to claim 32 wherein the angled opening of the outer end of each the tube is angled in the range of 45±5 degrees.

34. An apparatus for wet processing a wafer, the apparatus comprising:

a processing chamber, wherein the wafer is processed in the processing chamber;

a means for supporting and rotating the wafer about an upright axis within the processing chamber; and a nozzle through which a flow of fluid is directed onto the wafer, the nozzle comprising;

a nozzle housing in communication with a fluid supply;

means for directing a first fluid flow to a first area of the wafer and for directing a second fluid flow to a second area of the wafer while the wafer is rotated within the processing chamber, the means for directing including means for reducing the fluid pressure of the first fluid flow and the second fluid flow as the fluid flows through the means for directing; and wherein the nozzle is positioned downwardly over the wafer.

35. An apparatus according to claim 34 wherein the means for directing directs the first fluid flow to a center area of the wafer and directs the second fluid flow to an area of the wafer substantially one-third the diameter of the wafer wherein the rotation of the wafer causes the fluid to overflow toward the outer edge of the wafer.

\* \* \* \* \*